(12) United States Patent
Weiss (10) Patent No.: US 12,176,380 B2
(45) Date of Patent: Dec. 24, 2024

(54) OPTOELECTRONIC SEMICONDUCTOR DEVICE WITH A PLURALITY OF IMAGE ELEMENTS AND SEPARATING ELEMENTS, AND METHOD FOR PRODUCING THE OPTOELECTRONIC SEMICONDUCTOR DEVICE

(71) Applicant: OSRAM Opto Semiconductors GmbH, Regensburg (DE)

(72) Inventor: Guido Weiss, Pielenhofen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 456 days.

(21) Appl. No.: 17/439,826

(22) PCT Filed: Mar. 16, 2020

(86) PCT No.: PCT/EP2020/057135
§ 371 (c)(1),
(2) Date: Sep. 16, 2021

(87) PCT Pub. No.: WO2020/187845
PCT Pub. Date: Sep. 24, 2020

(65) Prior Publication Data
US 2022/0130894 A1 Apr. 28, 2022

(30) Foreign Application Priority Data

Mar. 19, 2019 (DE) .......................... 102019107030.9

(51) Int. Cl.
*H01L 27/15* (2006.01)
*H01L 33/00* (2010.01)
(Continued)

(52) U.S. Cl.
CPC ........ *H01L 27/156* (2013.01); *H01L 33/0093* (2020.05); *H01L 33/22* (2013.01);
(Continued)

(58) Field of Classification Search
None
See application file for complete search history.

(56) References Cited

U.S. PATENT DOCUMENTS 9,954,028 B2 * 4/2018 Yeon ........................ H01L 33/44
11,121,124 B2 * 9/2021 Pfeuffer .................. H01L 33/06
(Continued)

FOREIGN PATENT DOCUMENTS

CN 104011864 A 8/2014
CN 107731861 A 2/2018
(Continued)

OTHER PUBLICATIONS

International Search Report for Intenational Application No. PCT/EP2020/057135, mailed on May 27, 2020, 3 p.p.(for informational purposes only).
(Continued)

*Primary Examiner* — Robert K Carpenter
(74) *Attorney, Agent, or Firm* — Viering, Jentschura & Partner mbB; Benjamin L. von Rueden (57) ABSTRACT

An optoelectronic semiconductor device may include a plurality of picture elements, each of which include a first semiconductor layer of a first conductivity type and a second semiconductor layer of a second conductivity type arranged one above the other to form a semiconductor layer stack. The optoelectronic semiconductor device further includes separating elements arranged between adjacent picture elements and extend in a horizontal direction along a boundary of the adjacent picture element, adjoin the first and the second semiconductor layers, respectively, and extend in the vertical direction through the first and the second semiconductor layers, respectively.

17 Claims, 7 Drawing Sheets

(51) Int. Cl.
   *H01L 33/22* (2010.01)
   *H01L 33/38* (2010.01)
   *H01L 33/46* (2010.01)
   *H01L 33/50* (2010.01)
   *H01L 33/62* (2010.01)

(52) U.S. Cl.
   CPC .............. *H01L 33/38* (2013.01); *H01L 33/46* (2013.01); *H01L 33/50* (2013.01); *H01L 33/62* (2013.01); *H01L 2933/0016* (2013.01); *H01L 2933/0025* (2013.01)

(56) References Cited

U.S. PATENT DOCUMENTS

| | | |
|---|---|---|
| 2009/0283787 A1 | 11/2009 | Donofrio et al. |
| 2012/0086026 A1 | 4/2012 | Engl et al. |
| 2014/0319547 A1 | 10/2014 | Rode et al. |
| 2015/0014716 A1 | 1/2015 | von Malm |
| 2015/0255692 A1* | 9/2015 | Pfeuffer .................. H01L 33/62 438/27 |
| 2015/0279902 A1 | 10/2015 | Von Malm et al. |
| 2015/0325598 A1 | 11/2015 | Pfeuffer et al. |
| 2015/0333047 A1 | 11/2015 | Pfeuffer |
| 2017/0352700 A1 | 12/2017 | Malm |
| 2018/0047780 A1 | 2/2018 | Yeon et al. |
| 2018/0062047 A1 | 3/2018 | Biwa et al. |
| 2018/0166499 A1 | 6/2018 | Pfeuffer et al. |
| 2018/0358339 A1 | 12/2018 | Iguchi |
| 2020/0028045 A1 | 1/2020 | Weiss et al. |
| 2020/0058629 A1 | 2/2020 | Pfeuffer et al. |

FOREIGN PATENT DOCUMENTS

| | | |
|---|---|---|
| DE | 102012101409 A1 | 6/2013 |
| DE | 102012112530 A1 | 6/2014 |
| DE | 102016123013 A1 | 5/2018 |
| DE | 102017106410 A1 | 9/2018 |
| DE | 102018128692 A1 | 5/2020 |
| JP | 2012527116 A | 11/2012 |
| JP | 2015501085 A | 1/2015 |
| JP | 2016502123 A | 1/2016 |
| JP | 2018520504 A | 7/2018 |
| WO | 2013092304 A1 | 6/2013 |
| WO | 2018122354 A1 | 7/2018 |

OTHER PUBLICATIONS

Search Report for German Patent Application No. 102019107030.9, issued on Dec. 20, 2019, 8p.p. (for informatinal purposes only).

Notice of Reasons for Refusal for the corresponding JP Patent Application No. 2021-556679, mailed on Oct. 5, 2022, 8 pages (For informational purposes only).

Search Report for the corresponding JP Patent Application No. 2021-556679, communicated on Sep. 27, 2022, 33 pages (For informational purposes only).

Chinese office action issued for the corresponding Chinese patent application No. 202080021799.6, dated Mar. 1, 2024, 11 pages (for informational purposes only).

\* cited by examiner

OPTOELECTRONIC SEMICONDUCTOR DEVICE WITH A PLURALITY OF IMAGE ELEMENTS AND SEPARATING ELEMENTS, AND METHOD FOR PRODUCING THE OPTOELECTRONIC SEMICONDUCTOR DEVICE

CROSS-REFERENCE TO RELATED APPLICATIONS

The present application is a national stage entry according to 35 U.S.C. § 371 of PCT Application No. PCT/EP2020/057135 filed on Mar. 16, 2020; which claims priority to German Patent Application Serial No. 10 2019 107 030.9 filed on Mar. 19, 2019; all of which are incorporated herein by reference in their entirety and for all purposes.

TECHNICAL FIELD

An optoelectronic semiconductor device having a plurality of image elements and separating elements is specified. In addition, a method of producing the optoelectronic semiconductor device is specified.

BACKGROUND

A light-emitting diode (LED) is a light emitting device which is based on semiconductor materials. An LED usually includes a pn junction. If electrons and holes recombine with one another in the area of the pn junction, for example, because a corresponding voltage is applied, electromagnetic radiation is generated. LEDs have been developed for a variety of applications including display devices, lighting devices, automotive lighting, projectors and others. For example, arrangements of LEDs or light-emitting areas, each comprising a plurality of LEDs or light-emitting areas, are widely used for these purposes.

SUMMARY

One objective includes an improved optoelectronic semiconductor device comprising a plurality of picture elements and an improved method for its production.

An optoelectronic semiconductor device includes a plurality of picture elements. The picture elements each include a first semiconductor layer of a first conductivity type and a second semiconductor layer of a second conductivity type, which are arranged one above the other to form a semiconductor layer stack. The optoelectronic semiconductor device further includes separating elements which are arranged between adjacent picture elements and extend in a horizontal direction along a boundary of the adjacent picture element, adjoin the first and the second semiconductor layers, respectively, and extend in the vertical direction through the first and the second semiconductor layers, respectively.

The separating elements each include, for example, a separating trench in which a dielectric layer is arranged. In addition, a metallic layer may further be arranged in each of the separating trenches, and the dielectric layer is arranged between the metallic layer and the adjacent semiconductor material.

According to embodiments, the separating elements extend in each case in the vertical direction from a surface of the first semiconductor layer facing away from the second semiconductor layer to at least one surface of the second semiconductor layer facing away from the first semiconductor layer.

The optoelectronic semiconductor device may further include a converter material which is arranged over a first main surface of the second semiconductor layer, with the separating element adjoining the converter material.

In addition, the optoelectronic semiconductor device may comprise a first current spreading layer, which is arranged on a side of the first semiconductor layer facing away from the second semiconductor layer and is electrically connected to the first semiconductor layer.

According to embodiments, the optoelectronic semiconductor device further includes a second current spreading layer, which is arranged on a side of the first semiconductor layer facing away from the second semiconductor layer and is connected to the second semiconductor layer via contact elements.

The optoelectronic semiconductor device may further include a first connection element, which is electrically connected to the first current spreading layer, and a second connection element, which is electrically connected to the second current spreading layer.

For example, the separating elements have a width of less than 10 µm. The separating elements may also have a length of less than 50 µm.

The optoelectronic semiconductor device may, for example, comprise more than 100 picture elements.

A method for producing an optoelectronic semiconductor device includes forming a layer stack, which includes a first semiconductor layer of a first conductivity type and a second semiconductor layer of a second conductivity type, over a growth substrate, and forming separating trenches in a first surface of the first semiconductor layer. The separating trenches adjoin the first and the second semiconductor layers, respectively, and extend in the vertical direction through the first and the second semiconductor layers, respectively, up to the growth substrate. The method further includes removing the growth substrate.

The method may further include forming a dielectric layer in the separating trenches before removing the growth substrate. For example, the method includes the introduction of a metallic layer after the dielectric layer has been formed and before the growth substrate is removed.

According to embodiments, the method further includes forming a first current spreading layer on a side of the first semiconductor layer facing away from the second semiconductor layer.

The method may further include forming a second current spreading layer on a side of the first semiconductor layer facing away from the second semiconductor layer and forming contact elements which extend through the first semiconductor layer, with the second current spreading layer being connected to the second semiconductor layer via the contact elements.

For example, the formation of contact elements and the formation of the separating elements include common process steps.

An optoelectronic component includes the optoelectronic semiconductor device as described above and a control device with a plurality of control elements which are each suitable for controlling one of the picture elements. The optoelectronic component may be selected, for example, from a motor vehicle lighting device, a projector and a display device.

BRIEF DESCRIPTION OF THE DRAWINGS

The accompanying drawings serve to provide an understanding of exemplary embodiments. The drawings illustrate exemplary embodiments and, together with the description, serve to explain them. Further exemplary embodiments and numerous of the intended advantages emerge directly from the following detailed description. The elements and structures shown in the drawings are not necessarily shown true to scale. Identical reference numerals refer to identical or corresponding elements and structures.

DETAILED DESCRIPTION

In the following detailed description, reference is made to the accompanying drawings, which form part of the disclosure, and in which specific exemplary embodiments are shown for purposes of illustration. In this context, directional terminology such as "top", "bottom", "front", "back", "over", "on", "in front of", "behind", "leading", "trailing", etc. refers to the orientation of the figures just described. Since the components of the exemplary embodiments may be positioned in different orientations, the directional terminology is only used for explanation and is not restrictive in any way.

The description of the exemplary embodiments is not restrictive, since also other exemplary embodiments exist and structural or logical changes may be made without deviating from the scope defined by the claims. In particular, elements of exemplary embodiments described in the following text may be combined with elements of other exemplary embodiments described, unless the context indicates otherwise.

The terms "wafer" and "semiconductor substrate" used in the following description may include any semiconductor-based structure that has a semiconductor surface. The wafer and structure are to be understood to include doped and undoped semiconductors, epitaxial semiconductor layers, possibly supported by a base, and further semiconductor structures. For example, a layer made of a first semiconductor material may be grown on a growth substrate made of a second semiconductor material or of an insulating material, for example, on a sapphire substrate. Further examples of materials for growth substrates include glass, silicon dioxide, quartz or a ceramic.

Depending on the intended use, the semiconductor may be based on a direct or an indirect semiconductor material. Examples of semiconductor materials particularly suited for generating electromagnetic radiation include, in particular, nitride semiconductor compounds which may, for example, generate ultraviolet, blue or longer-wave light such as GaN, InGaN, AlN, AlGaN, AlGaInN, AlGaInBN, phosphide semiconductor compounds, which may, for example, generate green or longer-wave light such as GaAsP, AlGaInP, GaP, AlGaP, as well as other semiconductor materials such as GaAs, AlGaAs, InGaAs, AlInGaAs, SiC, ZnSe, ZnO, $Ga_2O_3$, diamond, hexagonal BN, and combinations of the materials mentioned. The stoichiometric ratio of the compound semiconductor materials may vary. Further examples of semiconductor materials may include silicon, silicon germanium and germanium. In the context of the present description, the term "semiconductor" also includes organic semiconductor materials.

The term "substrate" generally includes insulating, conductive or semiconductor substrates.

The terms "lateral" and "horizontal", as used in this description, are intended to describe an orientation or alignment which runs essentially parallel to a first surface of a substrate or semiconductor body. This may, for example, be the surface of a wafer or a chip (die).

The horizontal direction may, for example, lie in a plane perpendicular to a direction of growth when layers are grown on.

The term "vertical", as used in this description, is intended to describe an orientation which is essentially perpendicular to the first surface of a substrate or semiconductor body. The vertical direction may, for example, correspond to a direction of growth when layers are grown on.

To the extent that the terms "have", "contain", "comprise", "include" and the like are used herein, they are open-ended terms that indicate the presence of said elements or features, but do not rule out the presence of other elements or features. The indefinite articles and the definite articles include both the plural and the singular, unless the context clearly indicates otherwise.

In the context of this description, the term "electrically connected" means a low-ohmic electrical connection between the connected elements. The electrically connected elements need not necessarily be directly connected to one another. Additional elements may be arranged between electrically connected elements.

The term "electrically connected" also includes tunnel contacts between the connected elements.

Usually, the wavelength of electromagnetic radiation emitted by an LED chip may be converted using a converter material which contains a phosphor. For example, white light may be generated by a combination of an LED chip, which emits blue light, and a suitable phosphor. For example, the phosphor may be a yellow phosphor which, when excited by the light from the blue LED chip, is suitable for emitting yellow light. The phosphor may, for example, absorb a portion of the electromagnetic radiation emitted by the LED chip. The combination of blue and yellow light is perceived as white light. The color temperature may be changed by adding further phosphors which are suitable for emitting light of a further wavelength, for example, a red wavelength. According to further concepts, white light may be generated by a combination that contains a blue LED chip and a green and a red phosphor. It goes without saying that a converter material may include a plurality of different phosphors, each of which emits different wavelengths.

Examples of phosphors are metal oxides, metal halides, metal sulfides, metal nitrides and others. These compounds may, in addition, contain additives that lead to specific wavelengths being emitted. For example, the additives may include rare earth materials. As an example of a yellow phosphor, YAG:Ce$^{3+}$ (yttrium aluminum garnet (Y$_3$Al$_5$O$_{12}$) activated with cerium) or (Sr$_{1.7}$Ba$_{0.2}$Eu$_{0.1}$)SiO$_4$ may be used. Further phosphors may be based on MSiO$_4$:Eu$^{2+}$, where M may be Ca, Sr or Ba. By selecting the cations with an appropriate concentration, a desired conversion wavelength may be selected. Many other examples of suitable phosphors are known.

According to applications, the phosphor material, for example, a phosphor powder, may be embedded in a suitable matrix material. For example, the matrix material may include a resin or polymer composition such as a silicone resin or an epoxy resin. The size of the phosphor particles may, for example, be in the micrometer or nanometer range.

According to further embodiments, the matrix material may include a glass. For example, the converter material may be formed by sintering the glass, for example, SiO$_2$, with further additives and phosphor powder, with the formation of a phosphor in the glass (PiG).

According to further embodiments, the phosphor material itself may be sintered to form a ceramic. For example, the ceramic phosphor may have a polycrystalline structure as a result of the sintering process.

According to further embodiments, the phosphor material may be grown by forming a single-crystal phosphor, for example, by using the Czochralski (Cz) method.

According to further embodiments, the phosphor material itself may be a semiconductor material which has a suitable band gap in volume or in layers for the absorption of the light emitted by the LED and for and of the emission of the desired conversion wavelength. In particular, it may be an epitaxially grown semiconductor material. For example, the epitaxially grown semiconductor material may have a band gap which corresponds to a lower energy than that of the primarily emitted light. Furthermore, several suitable semiconductor layers, each of which emits light of different wavelengths, may be stacked on top of one another. One or more quantum wells or quantum wells, quantum dots or quantum wires may be formed in the semiconductor material.

Figure 1A:
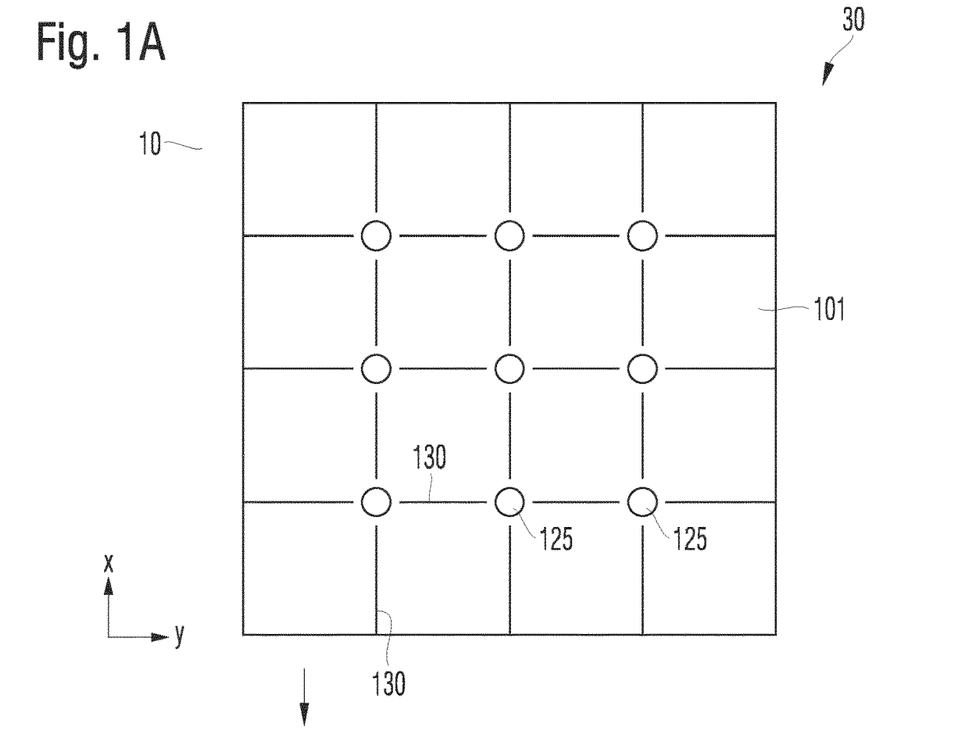
FIG. 1A shows a schematic plan view of an optoelectronic semiconductor device according to embodiments.

FIG. 1A shows a horizontal cross-sectional view of an optoelectronic semiconductor device 10 according to embodiments. The optoelectronic semiconductor device 10 includes a plurality of picture elements 101. The optoelectronic semiconductor device 10 further includes separating elements 130 which are arranged between adjacent picture elements 101. The separating elements 130 extend in a horizontal direction along a boundary of the adjacent picture element.

The picture elements may, for example, be suitable for generating or absorbing electromagnetic radiation. A more detailed structure of the individual picture elements will be explained with reference to FIGS. 2A to 2D. The picture elements 101 may have any form. For example, they may have a rectangular, for example, square form. However, other forms are also conceivable. The picture elements 101 may, for example, be arranged in rows and columns. According to further embodiments, other arrangement patterns are also conceivable.

The separating elements are in each case arranged between adjacent picture elements 101. They extend in each case along a boundary of the adjacent picture element. An extension length of the picture elements 101 may, in each case, be smaller than a lateral extension of the adjacent picture element. In a plan view, the separating elements 130 may each be designed in the shape of a line or rod, with their longitudinal axis corresponding to the longitudinal axis of the boundary of the picture elements 101. According to embodiments, contact elements 125 may further be provided which are suitable, for example, for connecting the second semiconductor layer to a second current spreading layer (not shown in FIG. 1A). The separating elements 130 may, in each case, be spaced apart from the contact elements 125 and not adjoin them.

Figure 1B:
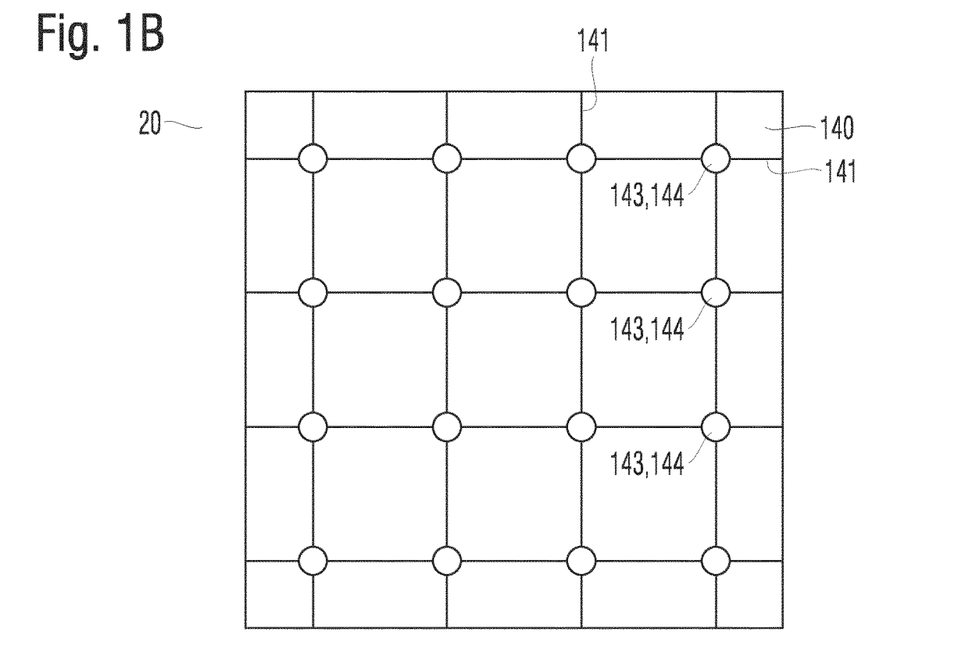
FIG. 1B shows a schematic plan view of a control device which may be combined with the optoelectronic semiconductor device shown in FIG. 1A.

FIG. 1B shows a control device 20 for controlling the optoelectronic semiconductor device of FIG. 1A. For example, the control device 20 includes a plurality of control or processing circuits 143, 144. Each of the control circuits 143 may be suitable for controlling an associated picture element 101. For example, the optoelectronic semiconductor device 10 of FIG. 1A may be connected to the control circuit 20 of FIG. 1B in such a manner that each of the control circuits 143 directly adjoins the picture element 101, which is to be controlled by the associated control circuit 143. The control device 20 may further comprise a plurality of control lines 141, through which the control circuits 143 may be addressed in each case. For example, the plurality of control circuits 143 may be implemented in a second substrate 140, for example, in a silicon substrate. According to further embodiments, the processing circuits 144 may also be suitable for further processing electromagnetic radiation or picture signals received from the picture elements.

Figure 2A:
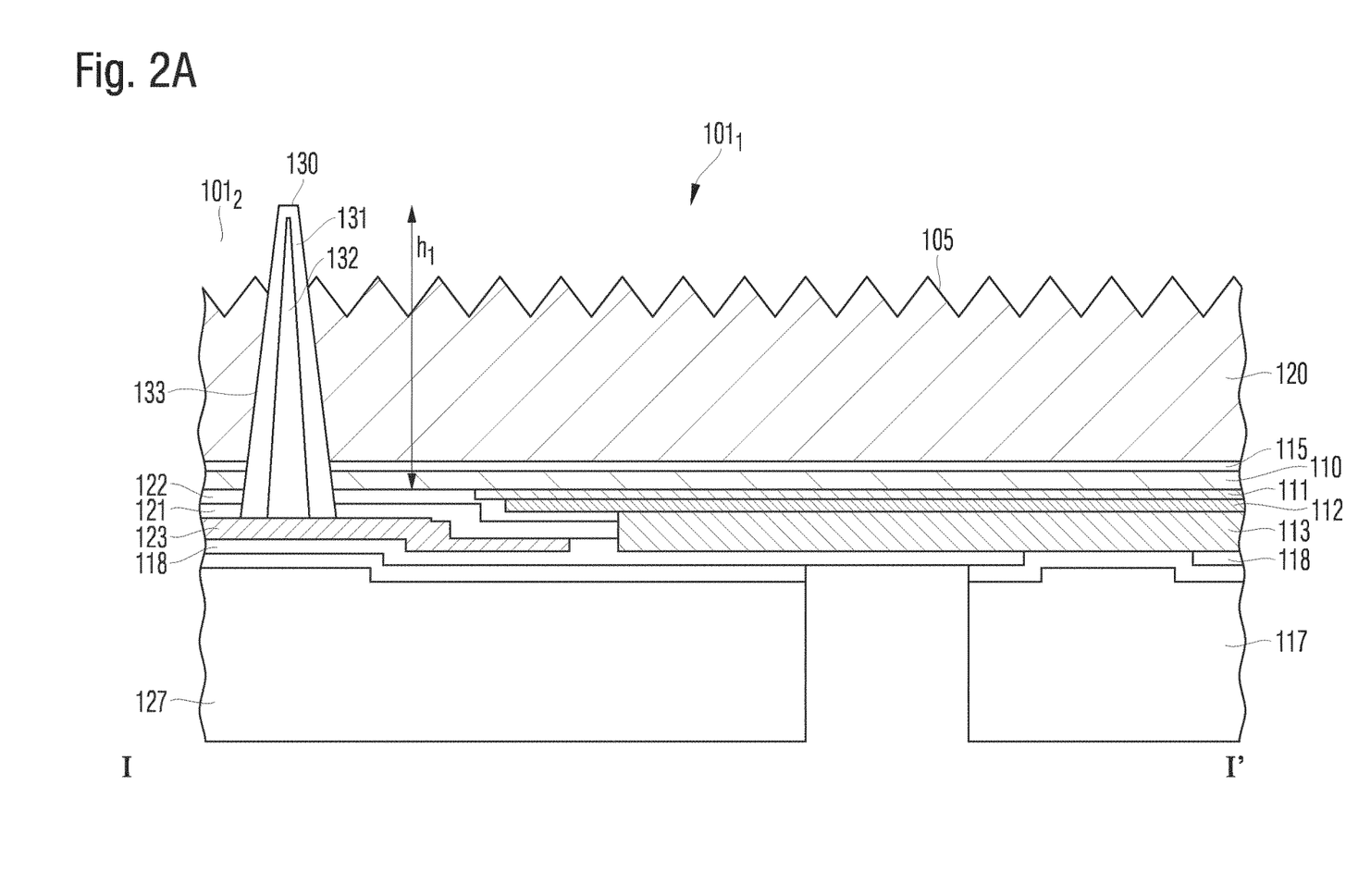
FIG. 2A shows a schematic cross-sectional view of part of an optoelectronic semiconductor device according to embodiments.

FIG. 2A shows a schematic cross-sectional view of part of an optoelectronic semiconductor device. The position of the cross-sectional view is located between I and I', as illustrated in FIG. 2C. The picture element 101$_1$ shown in FIG. 2A includes a first semiconductor layer 110 of a first conductivity type, for example, p-type, and a second semiconductor layer 120 of a second conductivity type, for example, n-type. The first and the second semiconductor layers are arranged one above the other to form a layer stack. For example, an active zone 115 may be arranged between the first semiconductor layer 110 and the second semiconductor layer 120.

The active zone may, for example, include a pn junction, a double heterostructure, a single quantum well structure (SQW, single quantum well) or a multi quantum well structure (MQW, multi quantum well) for the generation of radiation. In this process, the term "quantum well structure" has no meaning with regard to the dimensionality of the quantization. Thus, it includes, among other things, quantum wells, quantum wires and quantum dots, as well as any combination of these layers.

As further illustrated in FIG. 2A, the optoelectronic semiconductor device 10 further includes a separating element 130. The separating element 130 is arranged between adjacent picture elements 101$_1$, 101$_2$ and extends in a horizontal direction along a boundary of the adjacent picture element 101$_1$. The separating element 130 adjoins the first semiconductor layer 110 and the second semiconductor layer 120 and extends in the vertical direction through the first and the second semiconductor layers 110, 120, respectively. For example, the separating element 130 includes a trench 133 within which a dielectric layer 131 is arranged. For example, the dielectric layer 131 may contain silicon dioxide. A width b1 (not illustrated in FIG. 2A) of the trench 133 may, for example, be 4 µm, with the width being measured in a direction perpendicular to the longitudinal direction. For example, a layer thickness of the dielectric layer 131 may be 300 to 700 nm. An electrically conductive or metallic layer 132 may further be arranged within the trench 133. The electrically conductive layer 132 may be isolated from the adjacent semiconductor material by the dielectric layer 131. For example, the electrically conductive layer 132 may be a highly reflective layer and contain a metal, for example, silver.

The separating element 130 may extend in the vertical direction from a surface of the first layer 110 facing away from the second semiconductor layer 120 to at least one surface of the second semiconductor layer 120 facing away from the first semiconductor layer 110. For example, a height $h_1$ of the separating element 130—for example, in relation to a surface of the first semiconductor layer 110 facing away from the second semiconductor layer 120—may be greater than a height $h_2$ of a contact element 125 (shown in FIG. 2B).

As further shown in FIG. 2A, a contact layer 111 may, for example, be formed in electrical and physical contact with the first semiconductor layer 110. The contact layer 111 may, for example, contain silver. For example, the contact layer 111 may be suitably encapsulated by a suitable material. A further conductive layer 112 may be formed in contact with the contact layer 111. For example, the conductive layer 112 may include a metal, for example, Ti, Pt or Au. In addition, a first current spreading layer 113 may be formed on the side of the first semiconductor layer 110 facing away from the second semiconductor layer 120. For example, the first current spreading layer 113 may contain nickel. Furthermore, a second current spreading layer 123 may also be arranged over the side of the first semiconductor layer 110 facing away from the second semiconductor layer 120. For example, the first current spreading layer 113 and the second current spreading layer 123 may be insulated from one another by one or more insulating layers 121, 122. According to embodiments, the first current spreading layer 113 and the second current spreading layer 123 may be formed in approximately the same metallization plane.

According to further embodiments, one of the first or second current spreading layers 113, 123 may have a greater distance from the first semiconductor layer 110 than the other. A contact between the second current spreading layer 123 and the second semiconductor layer 120 will be explained in more detail with reference to FIG. 2B. A first connection element 117 is connected to the first current spreading layer 113 in an electrically conductive manner. Furthermore, as will be explained in the following text with reference to FIG. 2B, the second connection element 127 is electrically connected to the second current spreading layer 123. For example, the first and the second connection elements 117, 127 may be applied by a galvanic procedure. For example, the first connection element 117 and the second connection element 127 may contain copper. The first current spreading layer 113 may, for example, be insulated from the second connection element 127 by an insulating layer 118. The optoelectronic semiconductor device or the individual picture elements $101_1$, $101_2$ are thus each electrically controllable via the connection elements 117, 127. The first and second connection elements 117, 127 are arranged on a side of the optoelectronic semiconductor device facing away from the light exit surface 105.

Figure 2B:
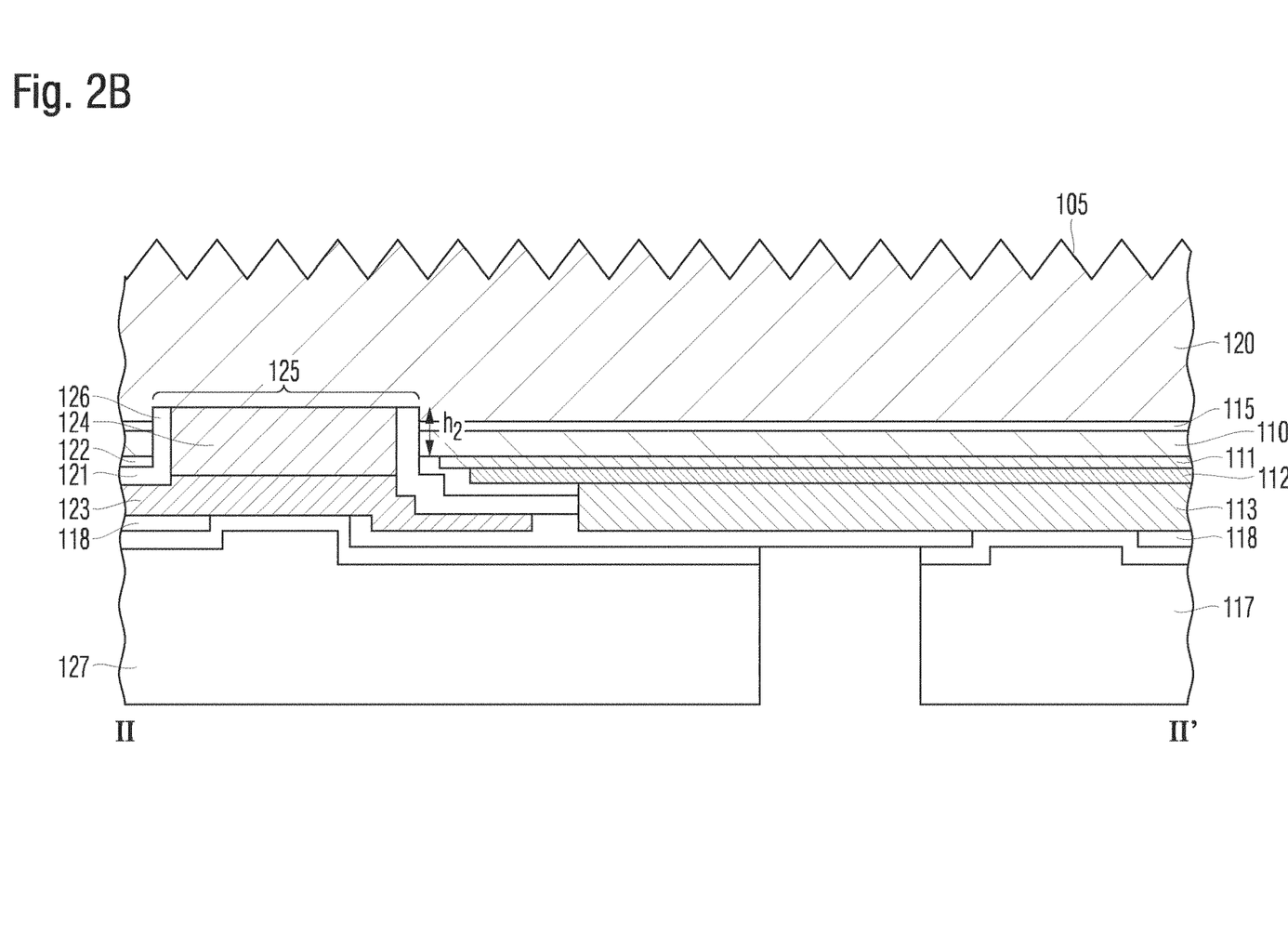
FIG. 2B shows a schematic cross-sectional view of a further part of the optoelectronic semiconductor device according to embodiments.
Figure 2C:
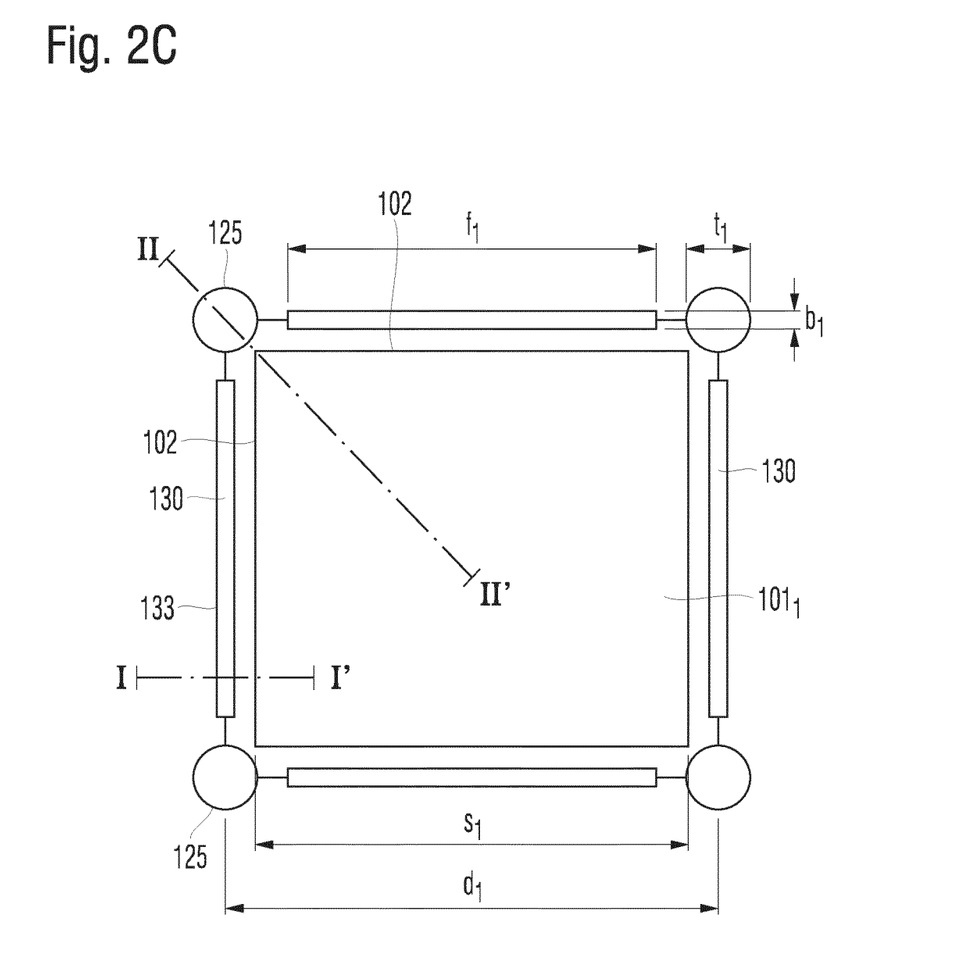
FIG. 2C shows a schematic plan view of elements of an optoelectronic semiconductor device according to embodiments.

FIG. 2B shows a schematic cross-sectional view through a picture element 101 of the optoelectronic semiconductor device between II and II', as indicated in FIG. 2C. Here, the cross-sectional view intersects a contact element 125, through which the second current spreading layer 123 is electrically connected to the second semiconductor layer 120. For example, the contact element may contain an electrically conductive material 124 which is insulated from the adjacent semiconductor material by a sidewall insulation 126. Furthermore, the second connection element 127 is connected to the second current spreading layer 123 in the illustrated cross-sectional view. As illustrated in FIGS. 2A and 2B, a first main surface 105 of the second semiconductor layer may be roughened in order to increase the outcoupling efficiency. Electromagnetic radiation generated in the active zone 115 may, for example, be output via the first main surface 105 of the second semiconductor layer 120. In a corresponding manner, electromagnetic radiation to be absorbed may penetrate into the active zone 115 of the picture element 101 via the first main surface 105 of the second semiconductor layer 120.

FIG. 2C shows a schematic horizontal cross-sectional view of a picture element 101 comprising adjacent separating elements 130 and contact elements 125. As illustrated in FIG. 2C, contact elements 125 are in each case arranged at the corners of a rectangularly designed picture element 101. The separating trenches 130 extend along the boundaries of the picture element 101. According to embodiments, the contact elements 125 may be arranged in any position. Furthermore, it is not necessary that four contact elements 125 are provided per picture element. As illustrated in FIG. 2C, the contact elements 125 and the separating elements 130 represent a frame of the picture element 101. Deviating therefrom, however, it is also possible that the contact elements 125 are, for example, arranged within the picture element 101. Furthermore, it is possible that the separating elements 130 also enclose the picture element 101 at the corners. An edge length s1 of the picture elements 101 may, for example, be less than 100 μm, for example, less than 50 μm, for example, 20 to 40 μm. Similarly, a length f1 of the separating elements 130 may be somewhat smaller than the edge length s1 of the picture element 101. For example, the length f1 of the separating elements 130 may be less than 50 μm, for example, less than 40 μm. A width b1 of the separating elements 130 may, for example, be less than 10 μm, for example, 2 to 5 μm, for example, 4 μm. A diameter t1 of the contact elements 125 may, for example, be less than 10 μm, for example, 6 to 10 μm, for example, 8 μm. A distance d1 between adjacent parallel separating elements may, for example, be less than 60 μm or less than 50 μm, for example, approximately 40 μm.

The separating elements 130 represent an optically opaque grid. The described separating elements may be used to achieve an improved contrast in pixelated chips. Due to the fact that the separating elements each include a trench which extends through the first and the second semiconductor layers, the contrast may be increased without undesired absorption of electromagnetic radiation taking place.

Figure 2D:
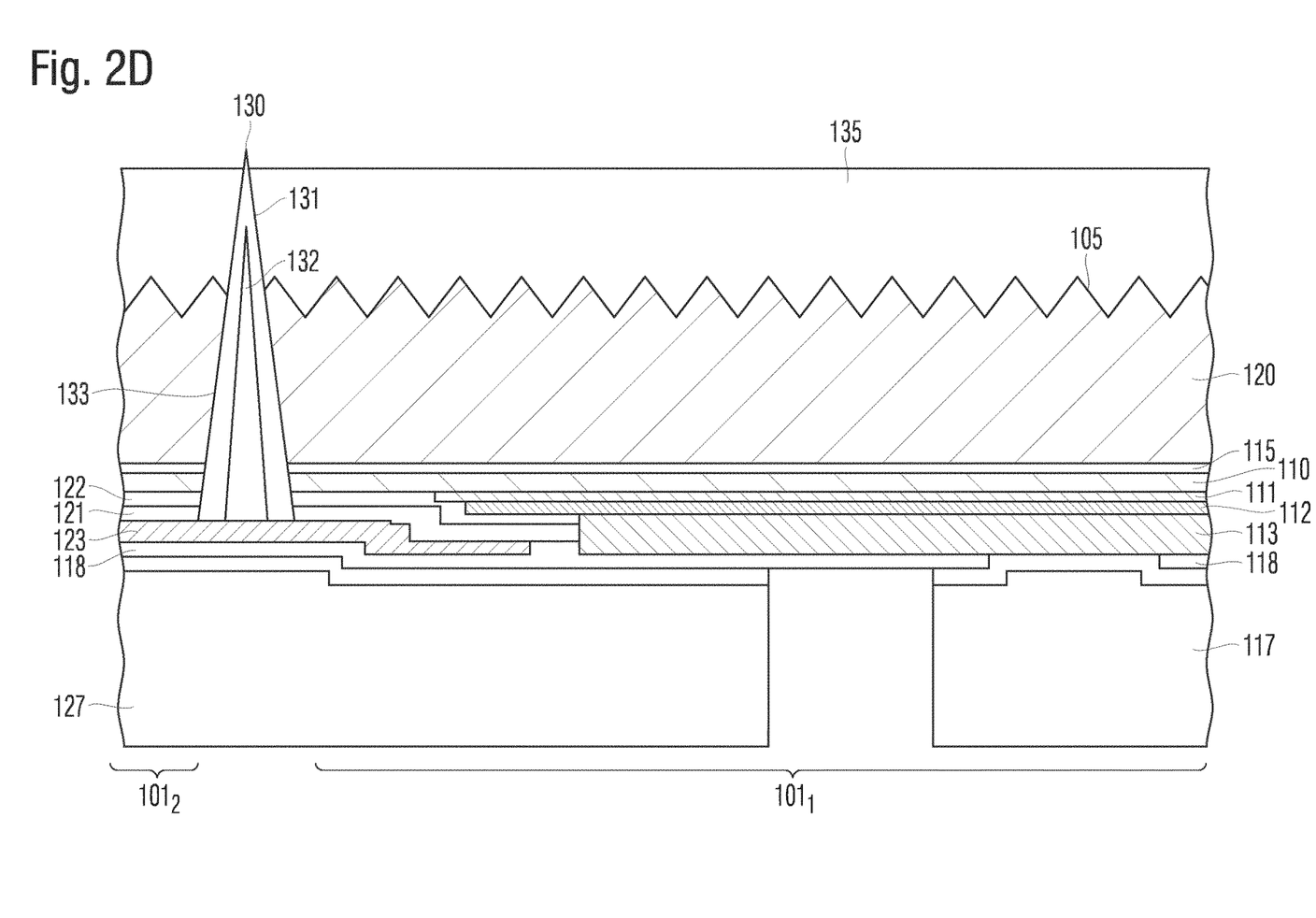
FIG. 2D shows a schematic cross-sectional view of an optoelectronic semiconductor device according to further embodiments.

FIG. 2D shows a cross-sectional view through the picture elements according to further embodiments. In addition to the elements discussed with reference to FIGS. 2A and 2B, the optoelectronic semiconductor device there includes a converter material 135 which is suitable for changing an emission wavelength of the electromagnetic radiation that is emitted by the particular picture element. With this arrangement, crosstalk of the converter between adjacent picture elements 101 may be prevented. For example, with this arrangement it is also possible to provide different converter materials 135 for different picture elements. Due to the fact that the separating element 130 protrudes from the first main surface 105 of the second semiconductor layer 120, it is possible to separate converter materials of the different picture elements from one another.

Figure 3A:
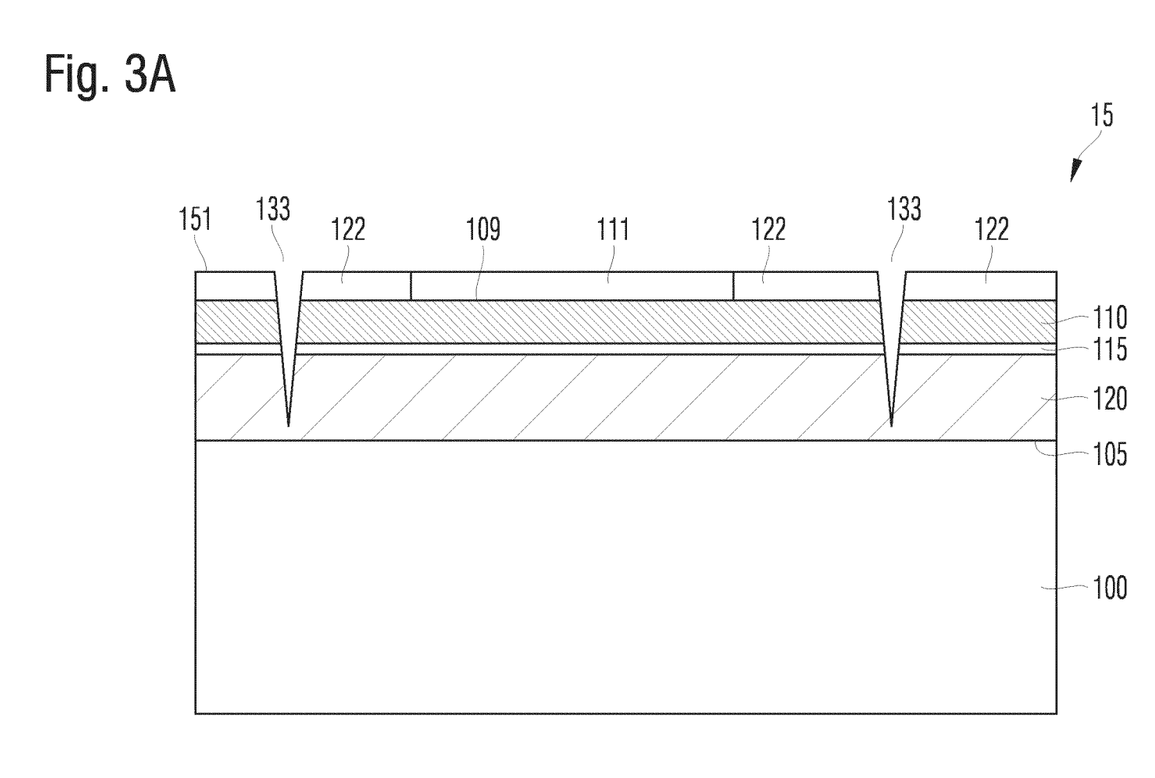
FIG. 3A illustrates a workpiece whilst performing a method according to embodiments.

FIG. 3A illustrates a vertical cross-sectional view of a workpiece 15 during the production of the optoelectronic device according to embodiments. First, the second semiconductor layer 120 and the first semiconductor layer 110 are grown over a suitable growth substrate 100. An active zone 115 may be formed between the second semiconductor layer 120 and the first semiconductor layer 110. After application of, for example, the first contact layer 111 over areas of the first semiconductor layer 110 and of insulating layers 122 over further areas of the first semiconductor layer 110, trenches 133 are formed in the first surface 151 of the workpiece 15 by etching. For example, the separating trenches 133 are etched to such a depth that they extend in the second semiconductor layer 120 almost to the first main surface 105 of the second semiconductor layer 120. After the separating trenches 133 have been etched, a dielectric layer 131 and a metallic or highly reflective layer 132 are filled into the separating trenches 133. Due to the fact that the separating trenches 133 are etched into the first surface 151 of the workpiece 15, it is possible to determine the position of the separating trenches with a high level of adjustment accuracy.

After the growth substrate 100 has been removed and the first main surface 105 of the second semiconductor layer 120 has been roughened, the separating elements 130 produced protrude from the first main surface 105 of the second semiconductor layer 120.

As a result of the process described, the edges of the particular picture elements 101 are thus at least partially severed from the side of the first semiconductor layer 110. After the separating trenches 133 have been filled with a dielectric and a highly reflective material, for example, silver, a highly reflective grid remains after the second semiconductor layer 120 has been finally roughened.

Figure 3B:
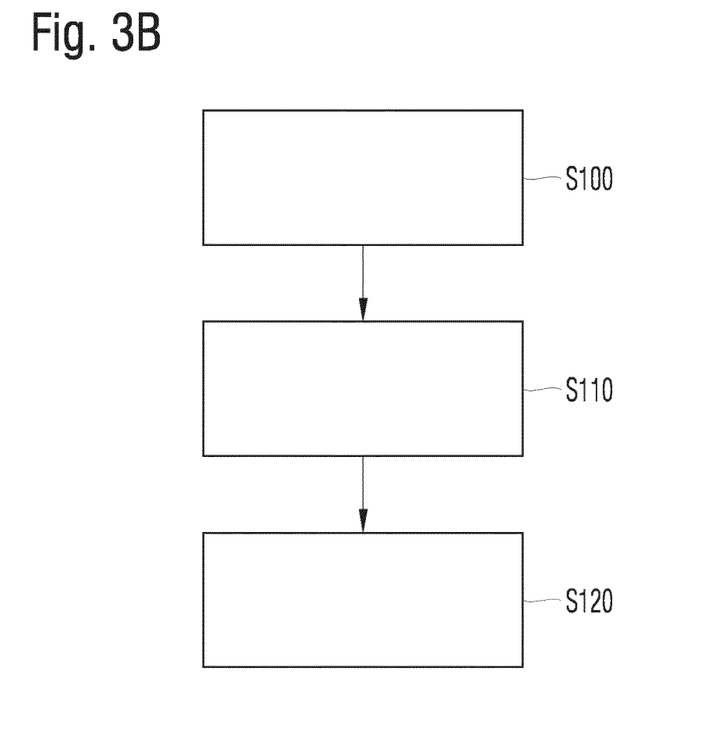
FIG. 3B summarizes a method according to embodiments.

FIG. 3B summarizes a method according to embodiments. A method for producing an optoelectronic semiconductor device includes forming (S100) a layer stack which includes a first semiconductor layer of a first conductivity type and a second semiconductor layer of a second conductivity type, over a growth substrate, forming (S110) separating trenches in a first surface of the first semiconductor layer, with the separating trenches adjoining the first and the second semiconductor layers, respectively, and extending in the vertical direction through the first and the second semiconductor layers, respectively, and removing (S120) the growth substrate.

Figure 4:
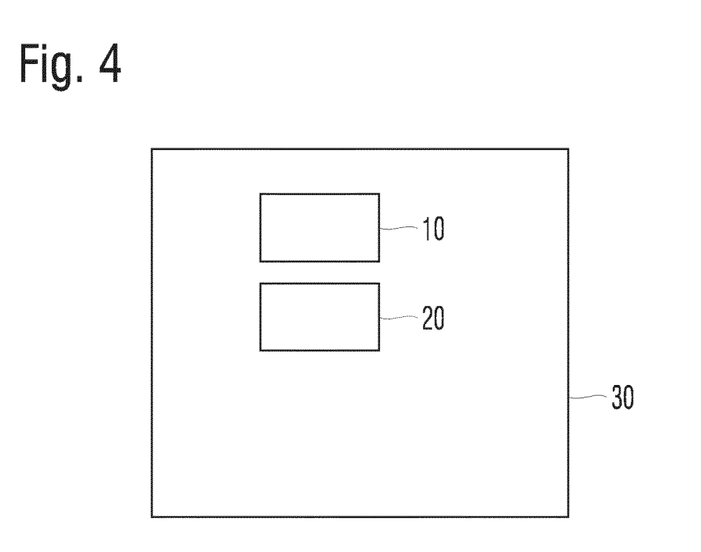
FIG. 4 shows an optoelectronic component according to embodiments.

FIG. 4 shows a schematic view of an optoelectronic component according to embodiments. The optoelectronic component 30 includes the optoelectronic semiconductor device 10 as described above. For example, the optoelectronic component may additionally include a control device 20, as described above with reference to FIG. 1B. For example, the optoelectronic component may be a motor vehicle lighting device, a projector, or a display device. According to embodiments, the motor vehicle lighting device may be a headlight, the individual picture elements of which are controlled by the control device 20 in such a manner that certain lighting patterns are generated. According to further embodiments, the motor vehicle lighting device may also be an interior lighting device. According to further embodiments, the optoelectronic component may also include a sensor. In this case, for example, the individual processing circuits 144 of the control device 20 may be suitable for processing the light signals received. The optoelectronic semiconductor device may, for example, include more than 100 picture elements 101, for example, more than 1000 picture elements 101.

LIST OF REFERENCES 10 optoelectronic semiconductor device
15 workpiece
20 control device
30 optoelectronic component
100 growth substrate
101 picture element
102 boundary of the picture element
105 first main surface of the second semiconductor layer
109 first main surface of the first semiconductor layer
110 first semiconductor layer
111 first contact layer
112 conductive layer
113 first current spreading layer
115 active zone
117 first connection element
118 insulating layer
120 second semiconductor layer
121 insulating layer
122 insulating layer
123 second current spreading layer
124 electrically conductive material
125 contact element
126 sidewall isolation
127 second connection element
130 separating element
131 dielectric layer
132 electrically conductive layer
133 separating trench
135 converter
140 second substrate
141 control line
143 control circuit
144 processing circuit
151 first main surface of the workpiece

The invention claimed is:

1. An optoelectronic semiconductor device comprising a plurality of picture elements, wherein each picture element comprises:
a first semiconductor layer of a first conductivity type and a second semiconductor layer of a second conductivity type arranged one above the other to form a semiconductor layer stack; and
separating elements between adjacent picture elements that extend in a horizontal direction along a boundary of the adjacent picture element, adjoin the first and the second semiconductor layers of the adjacent picture elements, respectively, and extend in a vertical direction through the first and the second semiconductor layers, respectively,
the optoelectronic semiconductor device further comprising a converter material arranged over a first main surface of the second semiconductor layer;
wherein:
the separating elements each comprise a separating trench in which a dielectric layer and a metallic layer are arranged, the separating elements adjoining the converter material and being configured to separate the converter material of adjacent picture elements;
the dielectric layer is arranged between the metallic layer and the adjacent semiconductor material, respectively; and
the separating elements extend the vertical direction from a surface of the first semiconductor layer facing away from the second semiconductor layer to one surface of the second semiconductor layer facing away from the first semiconductor layer and protrude from the surface of the second semiconductor layer facing away from the first semiconductor layer; and
the metallic layer does not overlap with the second semiconductor layer in a vertical direction in a region in which the separating element protrudes from the surface of the second semiconductor layer facing away from the first semiconductor layer.

2. The optoelectronic semiconductor device according to claim 1, further comprising a first current spreading layer arranged on a side of the first semiconductor layer facing away from the second semiconductor layer and is electrically connected to the first semiconductor layer.

3. The optoelectronic semiconductor device according to claim 2, further comprising a second current spreading layer arranged on a side of the first semiconductor layer facing away from the second semiconductor layer and is connected to the second semiconductor layer via contact elements.

4. The optoelectronic semiconductor device according to claim 3, further comprising a first connection element electrically connected to the first current spreading layer and a second connection element electrically connected to the second current spreading layer.

5. The optoelectronic semiconductor device according to claim 3, further comprising contact elements for electrically connecting the second semiconductor layer to the second current spreading layer, the contact elements being spaced apart from the separating elements.

6. The optoelectronic semiconductor device according to claim 1, wherein the separating elements have a width less than 10 µm.

7. The optoelectronic semiconductor device according to claim 1, wherein the separating elements have a length less than 50 µm.

8. The optoelectronic semiconductor device according to claim 1, which comprises more than 100 picture elements.

9. The optoelectronic semiconductor device according to claim 1, wherein the dielectric layer is configured to separate converter materials of adjacent picture elements from one another.

10. The optoelectronic semiconductor device according to claim 1, wherein the metallic layer is a reflective layer.

11. The optoelectronic semiconductor device according to claim 1, wherein the separating elements protrude from a surface of the converter material, the surface of the converter material facing away from the second semiconductor layer.

12. A method for producing an optoelectronic semiconductor device, wherein the method comprises:
    forming a layer stack having a first semiconductor layer of a first conductivity type and a second semiconductor layer of a second conductivity type, over a growth substrate;
    forming separating trenches in a first surface of the first semiconductor layer, wherein the separating trenches adjoin the first and the second semiconductor layers, respectively, and extend in a vertical direction through the first and the second semiconductor layers, respectively;
    forming a dielectric layer in the separating trenches;
    introducing a metallic layer of a reflective material so that the dielectric layer is arranged between the metallic layer and the adjacent semiconductor material, respectively, and insulates the metallic layer from the adjacent semiconductor material, with separating elements being formed, and
    removing the growth substrate such that the separating elements protrude from the surface of the second semiconductor layer facing away from the first semiconductor layer,
    the method further comprising forming a converter material over a first main surface of the second semiconductor layer, wherein the separating elements adjoin the converter material and are configured to separate the converter material of adjacent picture elements.

13. The method according to claim 12, further comprising forming a first current spreading layer on a side of the first semiconductor layer facing away from the second semiconductor layer.

14. The method according to claim 13, further comprising forming a second current spreading layer on a side of the first semiconductor layer facing away from the second semiconductor layer, and forming contact elements which extend through the first semiconductor layer, wherein the second current spreading layer is connected to the second semiconductor layer via the contact elements.

15. The method according to claim 14, wherein forming contact elements and forming the separating elements comprise joint process steps.

16. An optoelectronic component comprising;
    the optoelectronic semiconductor device according to claim 1; and
    a control device comprising a plurality of control circuits, each control circuit is configured to control one of the picture elements.

17. The optoelectronic component according to claim 16, which is selected from a motor vehicle lighting device, a projector, and a display device.

* * * * *